United States Patent
Felici et al.

(10) Patent No.: US 9,829,508 B2
(45) Date of Patent: Nov. 28, 2017

(54) TESTING HEAD OF ELECTRONIC DEVICES

(71) Applicant: TECHNOPROBE S.p.A., Cernusco Lombardone (IT)

(72) Inventors: Stefano Felici, Cernusco Lombardone (IT); Raffaele Vallauri, Cernusco Lombardone (IT); Roberto Crippa, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 192 days.

(21) Appl. No.: 14/791,012

(22) Filed: Jul. 2, 2015

(65) Prior Publication Data

US 2015/0309076 A1  Oct. 29, 2015

Related U.S. Application Data

(63) Continuation-in-part of application No. PCT/IB2014/000528, filed on Apr. 8, 2014.

(30) Foreign Application Priority Data

Apr. 9, 2013  (IT) .............................. MI2013A0561

(51) Int. Cl.
  *G01R 31/20*  (2006.01)
  *G01R 1/073*  (2006.01)

(52) U.S. Cl.
  CPC ..... *G01R 1/07321* (2013.01); *G01R 1/07357* (2013.01)

(58) Field of Classification Search
  CPC .............. G01R 1/0408; G01R 1/06705; G01R 1/06794; G01R 1/07314; G01R 1/07342; G01R 1/0483; G01R 1/0484; G01R 1/0466; G01R 31/2887; G01R 31/2886; G01R 31/2889; G01R 31/2891
  USPC ............ 324/750.16, 750.19, 750.22, 750.24, 324/750.25, 754.01–754.11, 324/756.01–756.05, 756.07, 757.01
  See application file for complete search history.

(56) References Cited

U.S. PATENT DOCUMENTS 5,376,889 A * 12/1994 Milroy ................... G01N 22/02
                                                        324/533
6,927,586 B2 * 8/2005 Thiessen ............ G01R 1/07307
                                                        324/755.11

(Continued)

FOREIGN PATENT DOCUMENTS

EP           1197756        *  4/2002

*Primary Examiner* — Thang Le
(74) *Attorney, Agent, or Firm* — Seed IP Law Group LLP

(57) ABSTRACT

It is described a testing head for a testing equipment of an electronic device comprising at least one upper guide and a lower guide provided with guide holes, a plurality of contact probes inserted into the guide holes of the upper and lower guides and at least one containment element of the probes being is disposed between the upper and lower guides, each of the contact probes having at least one terminal portion which ends with a contact tip adapted to abut on a respective contact pad of the electronic device to be tested; at least one spacer element sandwiched between the containment element and at least one of the upper and lower guides, the spacer element being removable to adjust a length of the terminal portions of the contact probes projecting from the lower guide.

24 Claims, 8 Drawing Sheets

(56) References Cited

U.S. PATENT DOCUMENTS

| | | | |
|---|---|---|---|
| 7,417,447 B2* | 8/2008 | Kister | G01R 1/07371 |
| | | | 324/750.16 |
| 2002/0041189 A1* | 4/2002 | Okubo | G01R 1/07357 |
| | | | 324/756.03 |
| 2004/0135594 A1 | 7/2004 | Beaman et al. | |
| 2006/0066328 A1* | 3/2006 | Clegg | G01R 1/07357 |
| | | | 324/755.06 |
| 2008/0150564 A1* | 6/2008 | Schmid | G01R 1/07357 |
| | | | 324/750.24 |
| 2009/0002009 A1* | 1/2009 | Brandorff | G01R 1/07357 |
| | | | 324/750.16 |

* cited by examiner

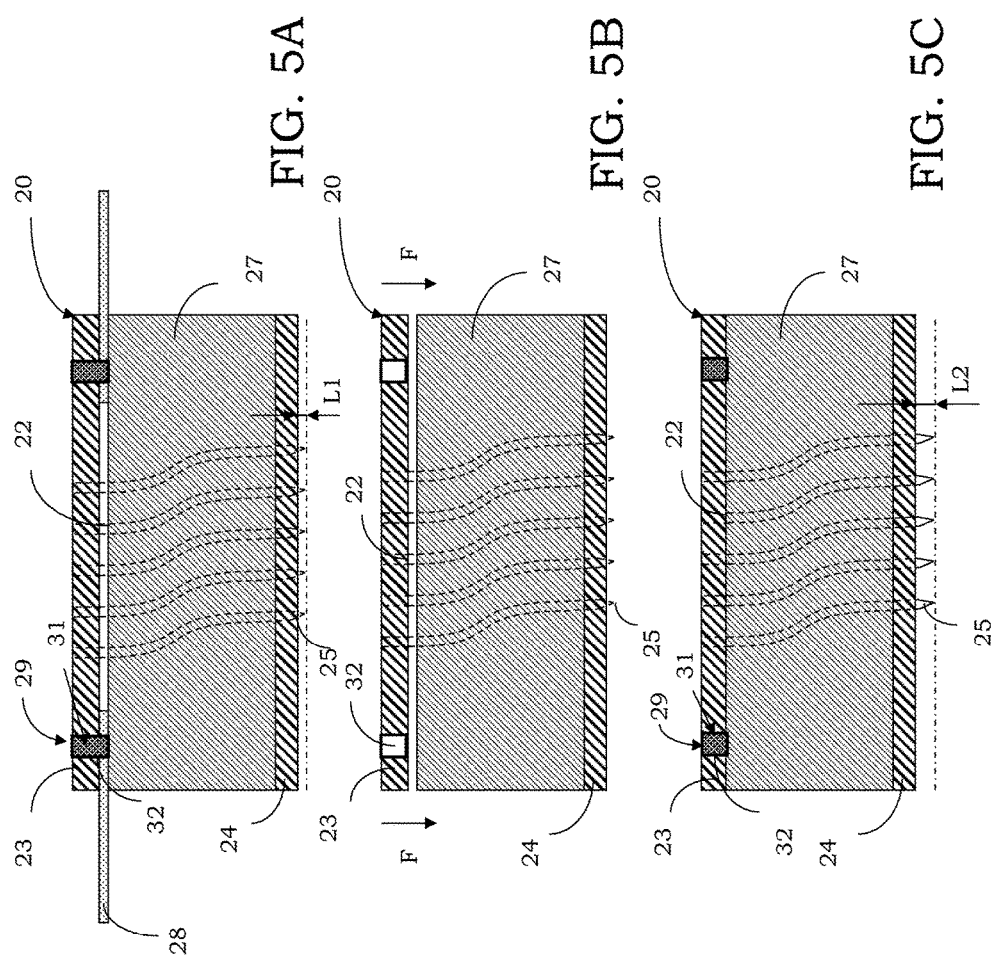

TESTING HEAD OF ELECTRONIC DEVICES

BACKGROUND

Technical Field

The present disclosure refers to a testing head for a testing equipment of electronic devices.

The disclosure refers particularly, but not exclusively, to a testing head with vertical probes not bound for testing electronic devices, in particular integrated on wafers and the description which follows is made with reference to this field of application with the only aim to simplify its description.

Description of the Related Art

As it is well known, a testing head is essentially a device suitable for making an electrical connection of a plurality of contact pads of a microstructure, in particular an electronic device integrated on wafers, with corresponding channels of a testing machine which verifies its function, in particular electrically, or generally for making its testing.

The test made on integrated devices aims in particular to detect and isolate faulty devices, in phase of production yet. Normally, the testing heads are then used for the electric testing of the devices integrated on wafers before cutting and mounting the same into a chip-containment package.

A testing head essentially comprises a plurality of movable contact elements or contact probes retained by at least one pair of plates or guides, being substantially plate-shaped and parallel to each other. Such guides are provided with suitable holes and placed at a certain distance to each other, in order to leave a free zone or air space for the movement and the possible deformation of the contact probes. The pair of guides comprises, in particular, upper and lower guides, both provided with guide holes, inside which the contact probes, normally made of special alloys with good electrical and mechanical properties, axially slide.

Furthermore, the testing head is completed with a containment element of the probes, disposed between the upper and lower guides, normally made of ceramic.

The good connection between the contact probes and the contact pads of the device to be tested is assured by the pressure of the testing head on the device itself, whereas the contact probes being movable inside the guide holes made in the upper and lower guides, are subject at such pressure contact to a bending at the inside of the air space between the two guides and to a sliding inside such guide holes. Testing heads of this type are normally indicated as "testing heads with vertical probes".

Substantially, such testing heads with vertical probes have an air space in which a bending of the contact probes occurs, such bending being favored by a suitable configuration of the probes themselves or of their guides, as shown schematically in FIG. 1, wherein for simplicity of illustration one and only contact probe has been represented, of a plurality of probes being normally comprised in a testing head.

In particular, in FIG. 1, a testing head 1 is schematically shown, comprising at least one upper guide 3 and one lower guide 4, having respective upper and lower guide holes 5, 6 within which at least one contact probe 10 slides.

The testing head 1 also comprises a containment element 7 of the probes, disposed between the upper and lower guides 3, 4.

The contact probe 10 has at least one end or contact tip 8. With the terms end or tip here and in the following description a terminal portion is meant, which is not necessarily pointed. In particular the contact tip 8 abuts against a contact pad 9 of a device 2 to be tested, so making the mechanical and electrical contact between said device and a testing equipment (not shown), the testing head being an end element thereof.

In some cases the contact probes are bound to the head itself at their upper guide in a fixed manner: reference is made to testing heads with blocked probes.

However, testing heads are frequently used with probes not bound in a fixed manner, but kept interfaced to a so-called board by means of a micro-contact board, called "space transformer": reference is made to testing heads with non-blocked probes.

In such case, the contact probe has a further contact tip towards a plurality of contact pads of the space transformer. The good electrical contact between probes and space transformer is assured in a similar manner to the contact with the device to be tested by means of the pressure of the probes on the contact pads of the space transformer.

The upper and lower guides 3, 4 are suitably spaced by an air space permitting the deformation of the contact probes 10. Finally, the upper and lower guide holes 5, 6 are so dimensioned as to permit a sliding of the contact probe 10 at their inside.

The shape of the deformation caused by the probes and the needed force to produce such deformation depend on many factors, such as:
  the physical features of the alloy making the probes;
  the offset between guide holes in the upper guide and respective guide holes in the lower guide; and
  the distance among the plates.

Furthermore, it should be noted that the correct working of a testing head is mainly tied to two parameters: the vertical displacement, or over-travel, of the contact probes and the horizontal displacement, or scrub, of the contact tips of such contact probes.

All these features should be evaluated and calibrated when producing a testing head, whereas the good electrical connection between probes and device should be always guaranteed.

In particular, it is important to assure the scrub of the contact tips which permits to "clean" the surfaces of the contact pads, so as to improve the contact made by the testing head throughout its working life.

The contact tips of the contact probes, in particular those for contacting the contact pads of the devices to be tested, are subject during use to a material accumulation, generally indicated as dirt, which reduces their performances.

It is therefore known to make cleaning operations of the contact tips by means of abrasive tissues.

Obviously such cleaning operations involve the consumption of a portion of the tip end of the probes, and they are therefore limited in number by the length of the tips of the probes. In particular, the subsequent abrasion of the tip portion should be limited to the tapered portion of the probe projecting from the lower guide 4, suitable for making a contact tip.

BRIEF SUMMARY

An embodiment of the disclosure is aimed to a testing head of electronic devices integrated on wafers, having structural and functional characteristics so as to permit an adequate number of cleaning operations without any functional loss, thus overcoming the limitations and the drawbacks that still afflict the heads made according to the known art.

The testing head mainly comprises at least one spacer element, disposed between the containment element of the probes and at least one of the upper or lower guides, so as to be easily removed and possibly strippable.

In particular, according to an embodiment, the testing head for a testing equipment of an electronic device comprises at least one upper guide and a lower guide provided with guide holes, a plurality of contact probes inserted into the guide holes of the upper and lower guides, at least one containment element of the probes being is disposed between the upper and lower guides, each of the contact probes having at least one terminal portion which ends with a contact tip adapted to abut on a respective contact pad of the electronic device to be tested; at least one spacer element sandwiched between the containment element and at least one of the upper and lower guides, the spacer element being removable to adjust a length of the terminal portions of the contact probes projecting from the lower guide.

In particular, the spacer element does not extend along a whole surface of the upper guide or lower guide.

According to an aspect of the disclosure, the spacer element may be interposed between the containment element and the upper guide.

Furthermore, the testing head may further comprise retaining means adapted to join the spacer element, the containment element and the upper or lower guide.

According to this aspect of the disclosure, each of the retaining means may comprise at least one screw housed in a respective threaded hole, made in the upper or lower guide at a positioning point of the spacer element.

Furthermore, the spacer element may comprise at least one hole adapted to house the screw.

According to another aspect of the disclosure, the testing head may comprise a plurality of spacer elements, being positioned in correspondence with a contour of the upper or lower guide.

In particular, such spacer elements may be positioned in an asymmetrical manner along the contour of the upper or lower guide.

The testing head may in particular comprise at least four spacer elements, positioned at corners of the upper or lower guide, being substantially rectangular-shaped.

Furthermore, the testing head may comprise at least four spacer elements, positioned at one central portion of sides of the upper or lower guide, being substantially rectangular-shaped.

The testing head may also comprise at least four spacer elements, positioned at corners of the upper and lower guides, being substantially rectangular-shaped, and at least other four spacer elements, positioned at a central portion of sides of said upper and lower guides, in different positions of the four spacer elements.

According to an aspect of the disclosure, the spacer element may be made of plastics.

According to another aspect of the disclosure, the spacer element may be paddle-shaped and comprise an elongated body and a head having dimensions greater than those of the elongated body.

Furthermore, according to still another aspect of the disclosure, the spacer element may comprise a plurality of layers overlapping and individually removable.

In particular, the layers may be mutually joined by means of an adhesive material with a reduced sealing, so as to permit in an easy manner the separation of the layers one from another.

The disclosure also relates to a method for adjusting a testing head comprising a plurality of contact probes inserted into guide holes being realized in at least one upper guide and in one lower guide, and at least one containment element of said probes which is disposed between said upper and lower guides, each of the contact probes having at least one terminal portion which ends with a contact tip adapted to abut onto a respective contact pad of a device to be tested and projecting from said lower guide to a length, the testing head further comprising at least one spacer element interposed between the containment element and at least one of the upper and lower guides, the method comprising the steps of:

de-joining the spacer element, the upper or lower guide and said containment element sandwiching the spacer element;

removing the spacer element;

approaching the upper or lower guide and the containment element; and joining the upper or lower guide and the containment element, so as to adjust a length of the terminal portions of the contact probes which projects from the lower guide.

According to one aspect of the disclosure, the testing head may comprise retaining means for joining the spacer element, the upper or lower guide and the containment element, which are formed by respective screws housed in respective threaded holes, the de-joining step comprising a de-blocking step of the retaining means by loosening or removing the screws and the joining step comprising a restoring step of the retaining means, through a new tightening of the screws in the threaded holes.

According to another aspect of the disclosure, the testing head may comprise spacer elements having a plurality of layers overlapping and individually removable, and the step of removing may comprise a step of removing one or more layers of the multi-layered spacer element.

Furthermore, the method may comprise further steps of de-joining the multilayered spacer element, the upper or lower guide and the containment element, removing one or more layers of the multilayered spacer element and approaching the upper or lower guide to the containment element, such further steps being executed in an immediate sequence or by a time interval from the preceding corresponding steps.

Finally, according to another aspect of the disclosure, the step of removing one or more layers of the multilayered spacer element may be carried out in an asymmetrical manner for a plurality of multilayered spacer elements being comprised in the testing head, so as to compensate misalignments of the lengths of the terminal portions of the contact probes, if any.

The features and advantages of the testing head and of the method according to the disclosure, will be clear from the following description of an example of its embodiment, given in an indicative and non limitative way with reference to the annexed drawings.

BRIEF DESCRIPTION OF THE SEVERAL VIEWS OF THE DRAWINGS

FIGS. 5A-5C schematically show a cross section view of the testing head of FIG. 2 in different phases of the method according to an embodiment of the invention;

DETAILED DESCRIPTION

Figure 1:
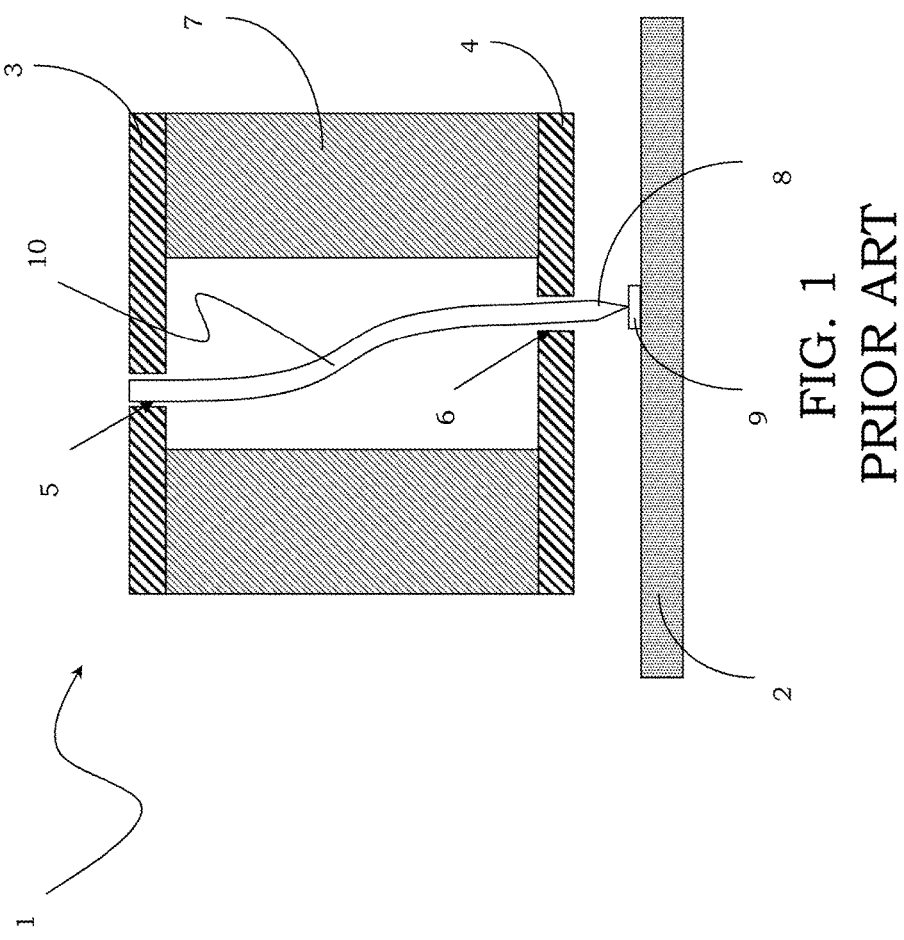
FIG. 1 schematically shows a testing head of electronic devices, in particular integrated on wafers, realized according to the prior art.
Figure 2:
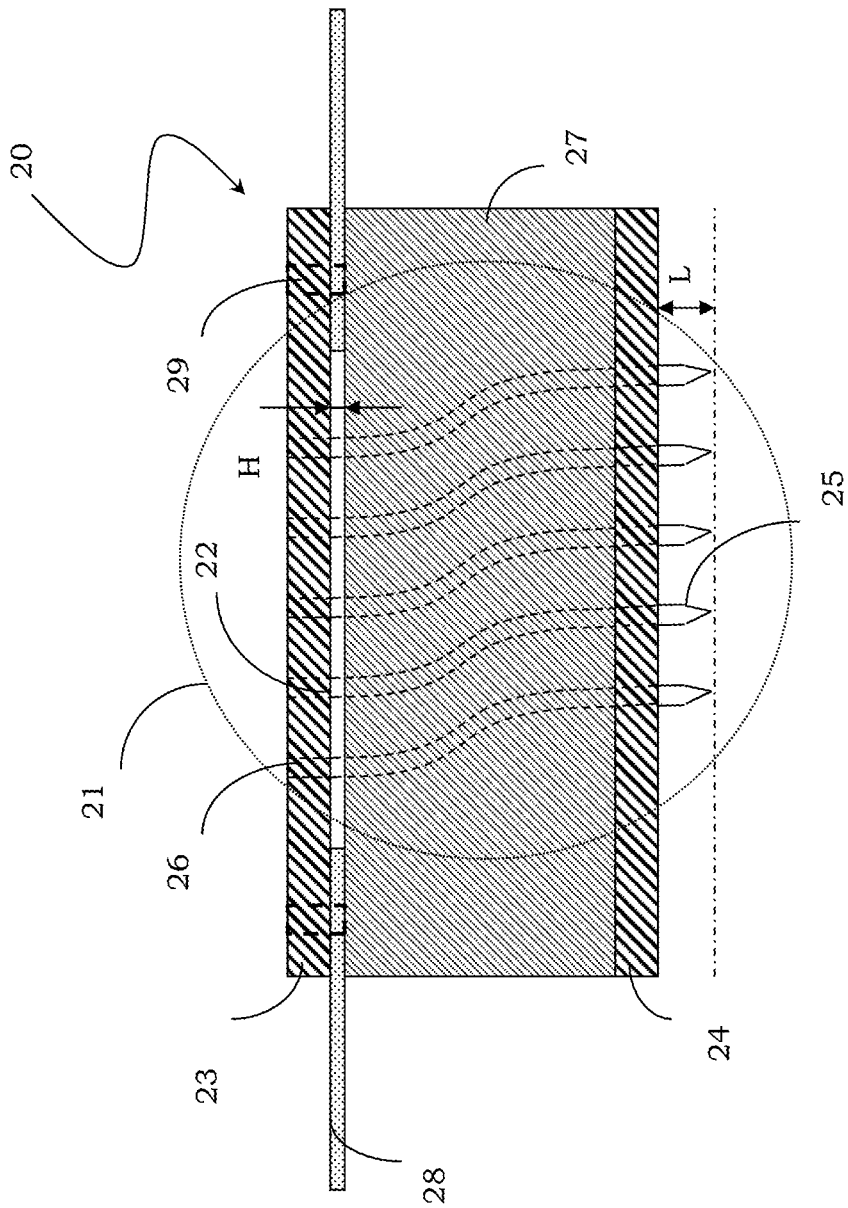
FIG. 2 schematically shows a section view of a testing head of electronic devices, in particular integrated on wafers, realized according to an embodiment of the invention.

With reference to such figures, and in particular to FIG. 2, reference 20 globally indicates a testing head realized according to an embodiment of the invention.

It should be noted that the figures represent schematic views and are not drawn to scale, but they are instead drawn in order to point out the important features of the embodiments of the invention.

Furthermore it should be noted that arrangements shown with reference to a particular embodiment can obviously be used in combination with other embodiments. Moreover, the same reference numerals are used in the various figures for indicating structurally and functionally corresponding elements.

The testing head 20 comprises a block of probes 21, which in turn comprise a plurality of contact probes 22. The testing head 20 also comprises at least one upper guide 23 and one lower guide 24, having respective guide holes within which the contact probes 22 slide.

In particular, each contact probe 22 has at least one terminal portion 25 in correspondence of the lower guide 24, which ends with a contact tip adapted to abut onto a respective contact pad of a device to be tested (not shown), by making the mechanical and electrical contact between said device and a testing equipment (not shown), the testing head being a terminal element thereof. As already pointed out, the term tip indicates a not necessarily sharpened end portion.

The contact probes 22 also have a further terminal portion 26 at the upper guide 23, possibly provided with a further contact tip towards a plurality of contact pads of a space transformer.

The terminal portion 25 of the contact probes 22 projects with a suitable length L with respect to the lower guide 24, with reference to an ideal plane realized by a device to be tested in pressure contact with the testing head 20. Such length L is reduced as the testing head 20 is used by virtue of the passages on an abrasive cloth of its tips, as explained with reference to the prior art.

The testing head 20 also comprises a containment element 27 of the probes, disposed between the upper 23 and lower guides 24.

The containment element 27 is substantially a case of the testing head, made for instance with ceramic, as described with reference to the known solutions.

According to an embodiment of the invention, the testing head 20 further comprises at least one spacer element 28 interposed between at least one upper or lower guide, and the containment element 27 of the probes, in particular, in the example shown in FIG. 2, between the upper guide 23 and the containment element 27. It should be noted that such placement of the spacer element 28 between the upper guide 23 and the containment element 27 is particularly suitable so as to guarantee an easy access to the spacer element 28, indeed.

In particular, the spacer element 28 does not extend along a whole surface of the upper guide 23 or the lower guide 24: Moreover, the spacer element 28 is not provided with through holes for housing the contact probes 22.

According to a preferred embodiment, the spacer element 28 is positioned in correspondence of a corner of the upper or lower guide 23, 24 being free from the guide holes housing the contact probes 22.

According to an embodiment of the invention, the spacer elements 28, disposed between the upper guide 23 and the containment element 27, create an air zone of height H, as shown in the figure. In particular, the contact probes 22, in correspondence of this air zone of height H, are not surrounded by the containment element 27, nor by the spacer element 28.

The testing head 20 also comprises respective retaining means 29, suitable for joining upper guide 23, spacer element 28 and containment element 27. The retaining means 29 are positioned in correspondence of a substantially central portion of the spacer element 28 being disposed and sandwiched between the upper guide 23 and the containment element 27.

Figure 3:
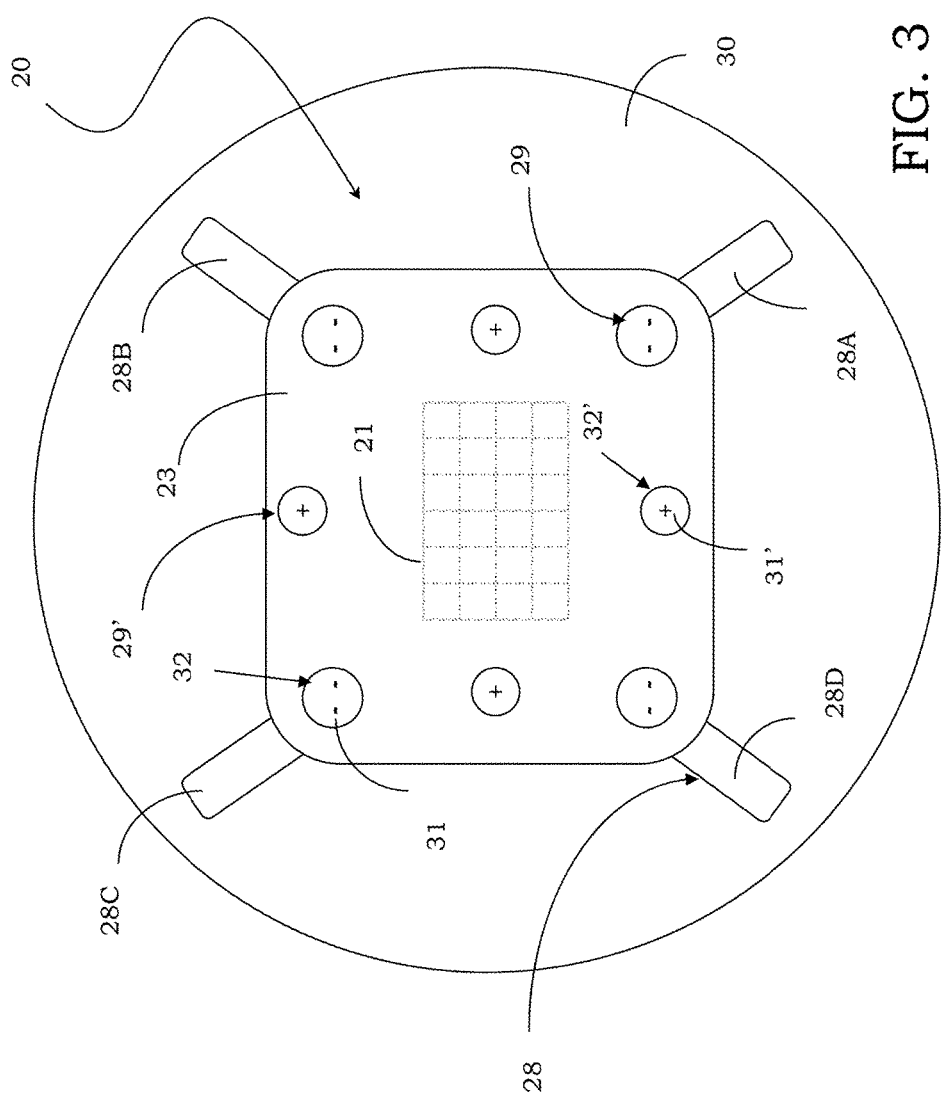
FIG. 3 schematically shows a top view of the testing head of FIG. 2.

As shown in FIG. 3, where the testing head 20 is mounted on a board 30, the retaining means 29 may be realized by means of screws 31, in particular thumbscrews, housed into respective threaded holes 32 provided in the upper guide 23 at positioning points of the spacer elements 28.

In particular, in the example shown in FIG. 3, which corresponds to the testing head 20 according to a preferred embodiment of the invention, four spacer elements are used, indicated with 28A, 28B, 28C and 28D, positioned at corners of the upper guide 23, with a substantially rectangular shape.

The testing head 20 may also comprise further retaining means 29', and in particular further screws 31', in the example shown Phillips head screws, housed into respective threaded holes 32' for joining the upper guide 23 and the containment element 27. The retaining means 29' are in particular disposed in areas of the upper guide 23 distinct from the points in which the spacer elements 28 are disposed.

In the example of FIG. 3, in particular, the testing head 20 comprises four further screws 31', disposed at the sides of the upper guide 23 of a substantially rectangular shape and centrally placed, in areas where the spacer elements 28 are not present.

It is obviously possible to provide different configurations for the spacer elements 28, which may be disposed with a different quantity, in a symmetrical manner or not with respect to central orthogonal axes of the corresponding guide, in particular the upper guide 23 with a substantially rectangular shape, and in different positions with respect to those shown in FIG. 3.

Examples of alternative embodiments of the testing head 20, particularly with reference to the number and position of the spacer elements 28, are shown in FIGS. 4A to 4D.

Figure 4A:
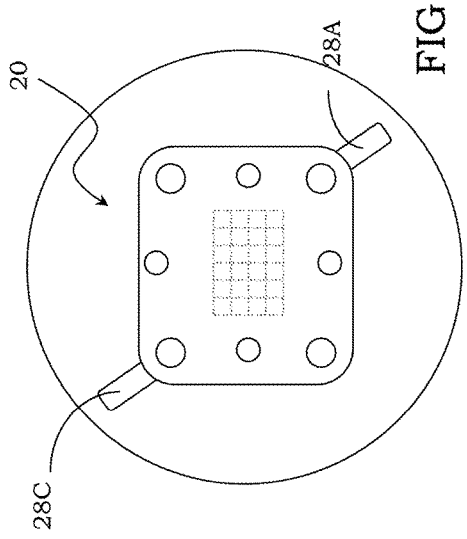
FIGS. 4A-4D schematically show in a top view the testing head realized according to alternative embodiments of the invention.

In particular, in FIG. 4A a testing head 20 is shown, which comprises just one spacer element, indicated with 28A as in FIG. 3, in particular positioned at a corner of the upper guide 23 with a substantially rectangular shape.

Figure 4B:
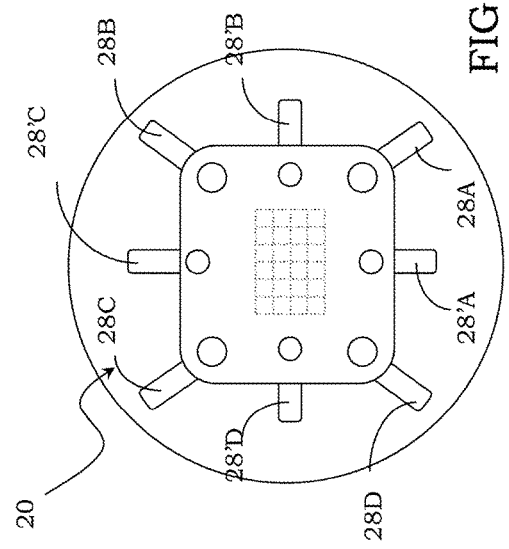

As an alternative, in FIG. 4B a testing head 20 is shown, which comprises two spacer elements, indicated with 28A and 28C, substantially arranged on a diagonal of the upper guide 23 with a substantially rectangular shape, in a symmetrical configuration with respect to central orthogonal axes of this upper guide 23.

Figure 4C:
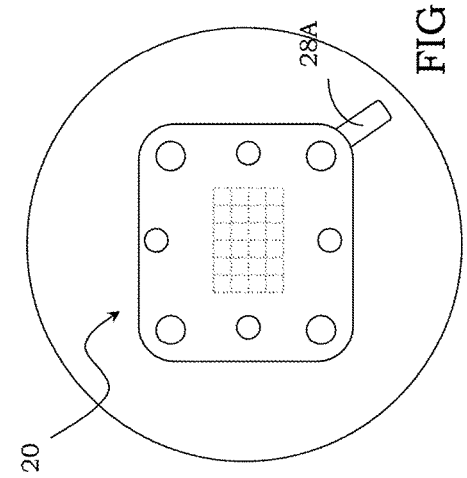

Furthermore, in FIG. 4C a testing head 20 is shown, which comprises three spacer elements, indicated with 28A, 28C and 28D, positioned at three of the four corners of the upper guide 23 with a substantially rectangular shape, in an asymmetrical configuration with respect to central orthogonal axes of the upper guide 23.

Figure 4D:
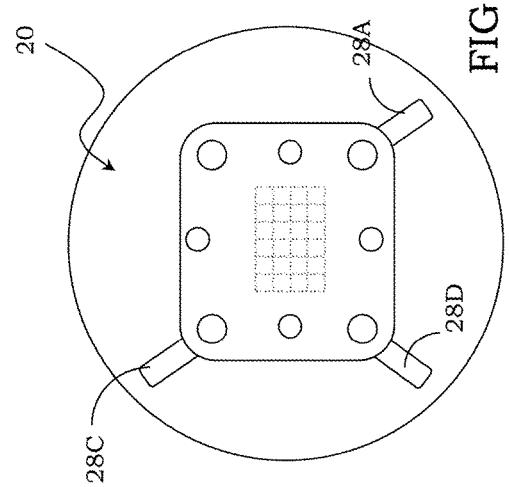

Finally, in FIG. 4D a testing head 20 is shown, which comprises four spacer elements, indicated with 28A, 28B, 28C and 28D, positioned at the corners of the upper guide 23 with a substantially rectangular shape and other four spacer elements, indicated with 28'A, 28'B, 28'C and 28'D, positioned at the sides of the upper guide 23 and centrally positioned at the other screws 31', in a fully symmetrical configuration with respect to central orthogonal axes of the upper guide 23 with a substantially rectangular shape.

In particular, the spacer elements are positioned at a same level in correspondence with a contour of the upper or lower guide.

A method for adjusting the length L of the terminal portions 25 of the contact probes 22 of a testing head 20 of the above referred type is also disclosed.

The method is particularly shown with reference to FIGS. 5A-5C.

In particular, the figures show a cross section of a testing head 20 which comprises at least two spacer elements 28, positioned between the upper guide 23 and the containment element 27 and joined by means of retaining means 29 realized by screws 31 housed into respective threaded holes 32.

In FIG. 5A, the testing head 20 has contact probes 22 with terminal portions 25 projecting with respect to the lower guide 24 with a length L1 which is less than a length of value L*, corresponding to a correct working of the testing head 20. Substantially, in such conditions, the testing head 20 is not suitable for applying a correct pressure contact of its contact probes 22 on corresponding contact pads of a device to be tested (not shown).

According to an embodiment of the invention, the method comprises a phase of releasing the retaining means 29 by loosening or removing the screws 31, followed by a phase of removing the spacer elements 28, as shown in FIG. 5B.

The method also comprises a following phase of approaching the upper guide 23 to the containment element 27 according to a direction indicated by the arrows F in the figures. The method finally comprises a phase of restoring the retaining means 29 through a new tightening of the screws 31 into the respective threaded holes 32 for rejoining the upper guide 23 and the containment element 27, as shown in FIG. 5C.

Thanks to the removal of the spacer elements 28, the testing head 20 in the configuration of FIG. 5C comprises contact probes 22 having terminal portions 25 which project with respect to the lower guide 24 with a length L2 equal or greater than the length of value L*, corresponding to a correct working of the testing head 20. Thus, with the method according to an embodiment of the invention, the correct function of the testing head 20 is therefore restored in an easy and quick manner.

Figure 6:
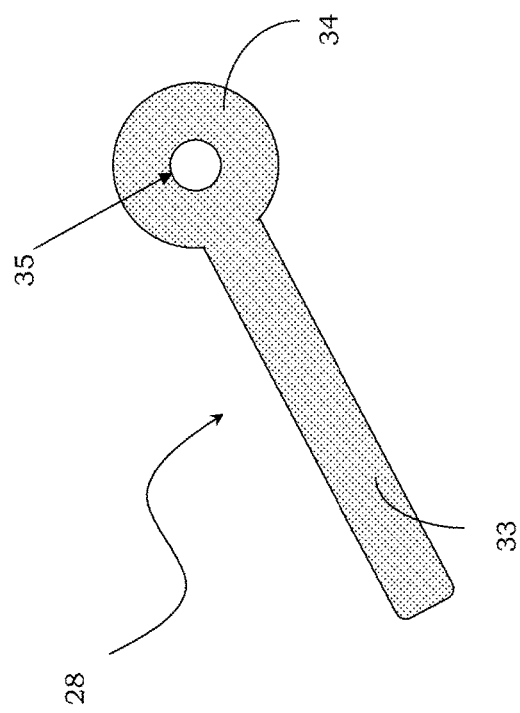
FIG. 6 schematically shows a top view of a detail of the testing head of FIG. 2.

A spacer element 28 may suitably be paddle-shaped, as schematically shown in FIG. 6. Such spacer element 28 may be realized in a plastic material.

In particular, the spacer element 28 comprises an elongated body 33 and a head 34, for example of circular shape, suitably having a hole 35 with dimensions apt to be crossed by the screws 31. Such shape of the spacer elements 28 is particularly suitable, in order to guarantee an easy gripping of such elements at the elongated body 33 at the time of removal of the same. Furthermore, the greater dimensions of the head with respect to the elongated body 33 guarantee a good distribution of the pressure load when tightening the retaining means 29, in particular tightening the screws 31 into the holes 32.

The spacer element 28 having this shape, positioned at the corners of a guide, in particular an upper guide 23 with a substantially rectangular shape, are correctly retained in correspondence of the pierced head 34, while the elongate body 33 projects from the guide, being thus easy to be gripped and removed, when needed.

It is also possible to realize the spacer elements 28 with the shape of squares or washers, suitably perforated in order to permit the passage of the screws 31.

The spacer elements 28 may also be realized by a plurality of layers overlapping and individually removable, possibly joined together through an adhesive material, as a glue, with reduced sealing, so as to permit in an easy manner the separation of the layers one from another. Spacer elements 28 of this type may be defined strippable spacer elements. Particularly, the layers are superimposed one another along an axis which is orthogonal to a plane defined by the spacer element 28 itself, so as to for a multilayered spacer element.

Figure 7:
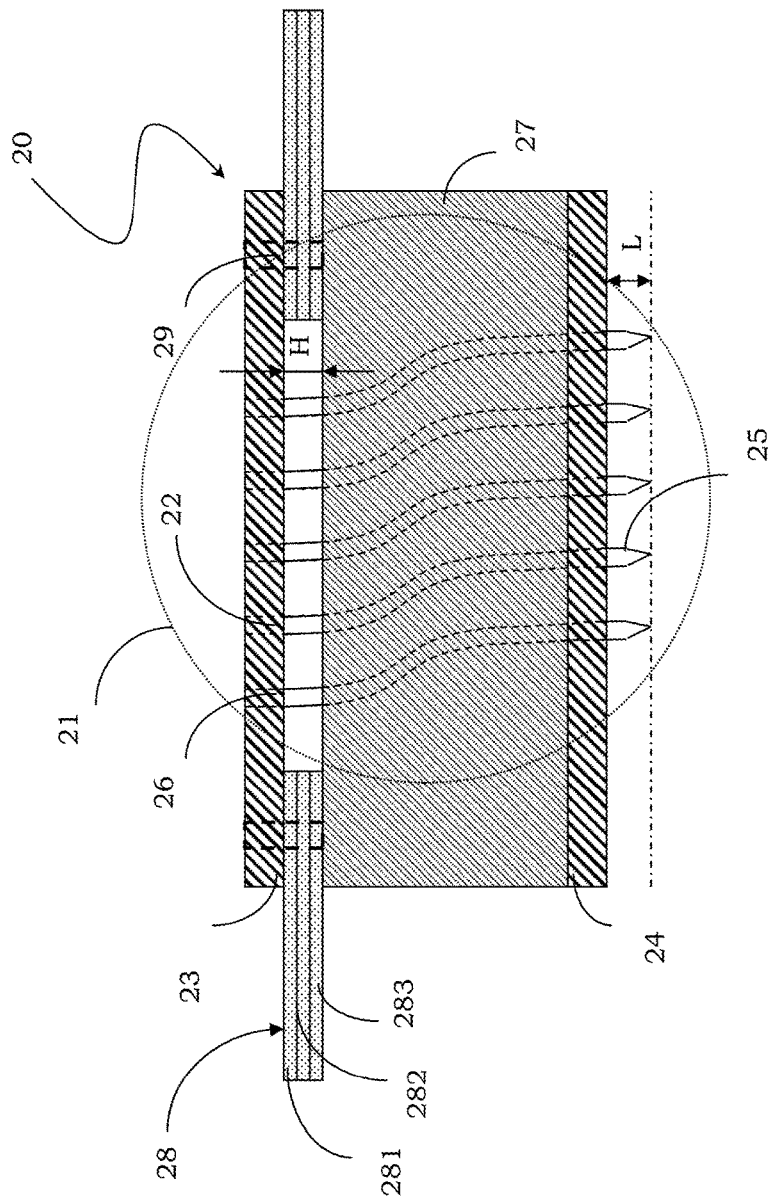
FIG. 7 schematically shows a section view of the testing head according to another alternative embodiment of the invention.

A testing head 20 comprising multilayered or strippable spacer elements 28 is schematically shown in FIG. 7.

In particular, in the example shown in such figures, each spacer element 28 comprises at least one first layer 281, one second layer 282 and one third layer 283, in particular with the same shape and thickness. Obviously, it is possible to consider spacer elements 28 having a different number of layers, possibly with a different thickness one from the other. Optionally, layers of an adhesive material with low sealing are interposed among the layers of the spacer element 28.

In such case it is possible to proceed with the removal of just one or more layers of the multilayered or strippable spacer elements 28, at the same time or sequentially, for an adjustment in stages of the length L of the terminal portions 25 of the contact probes 22.

According to an embodiment of the invention, the multilayered or strippable spacer elements 28, positioned between the upper guide 23 and the containment element 27, create an air space of height H1, in particular greater than the height H of the air space created by the spacer elements 28 of the testing head 20 shown in FIG. 2.

An alternative embodiment of the method for adjusting the length L of the terminal portions 25 of the contact probes 22 of a testing head 20 which comprises multilayered or strippable spacer elements 28 of the type shown in FIG. 7 is also disclosed. According to this alternative embodiment, the length L of the terminal portions 25 of the contact probes 22 is regulated in stages.

A possible implementation of the method according to this alternative embodiment of the invention, is shown in FIGS. 8A-8F.

Figure 8A:
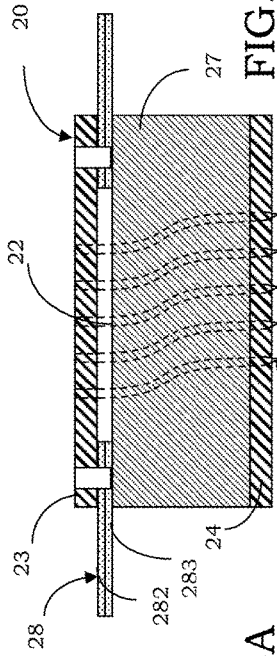
FIGS. 8A-8F schematically show the testing head of FIG. 7, sectioned in different phases of the method according to an alternative embodiment of the invention.

In FIG. 8A, the testing head 20 has contact probes 22 with terminal portions 25 projecting with respect to the lower guide 24 of a length smaller than a length corresponding to a correct working of the testing head 20. The testing head 20 comprises multilayered or strippable spacer elements 28 of the type shown in FIG. 7.

Figure 8B:
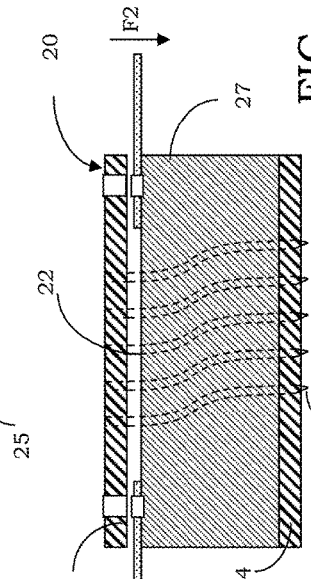

According to an embodiment of the invention, the method comprises an unlocking step of the retaining means 29 by loosening or removing the screws 31 followed by a removing step of at least one first layer 281 of the spacer elements 28, as shown in FIG. 8B.

Figure 8C:
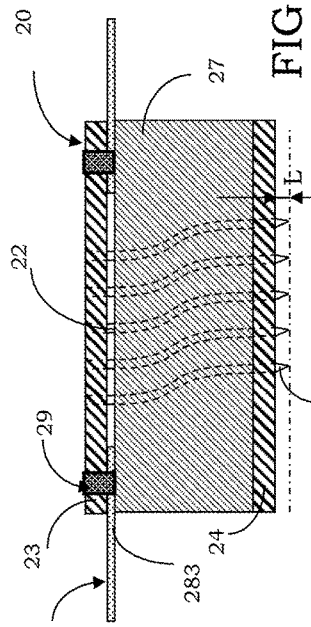

The method comprises a following step of approaching the upper guide 23 to the containment element 27 according to a direction indicated by the arrows F1, as shown in FIG. 8C.

Figure 8D:
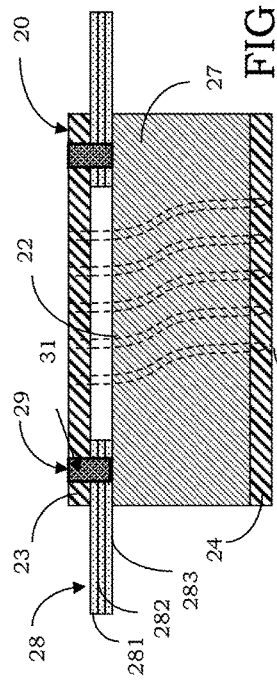
Figure 8E:
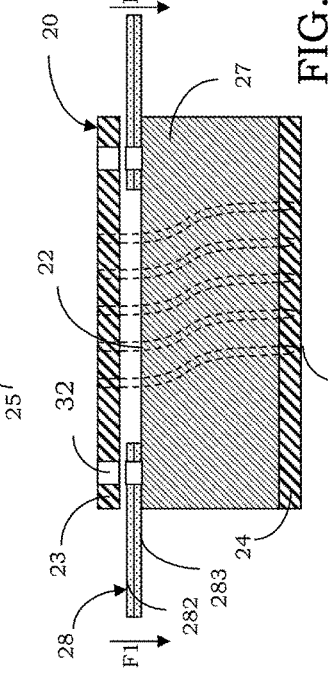

In the case where the contact probes 22, after approaching the upper guide 23 to the containment element 27, have terminal portions 25 which project with respect to the lower guide 24 of a length in any case smaller then a length corresponding to a correct working of the testing head 20, as shown in FIG. 8D, the method comprises a further unlocking step of the retaining means 29 by loosening or removing the screws 31 followed by a step of removing at least one second layer 282 of the spacer elements 28, as shown in FIG. 8E.

The method then comprises a further step of approaching the upper guide 23 to the containment element 27 according to a direction indicated by the arrows F2.

Figure 8F:
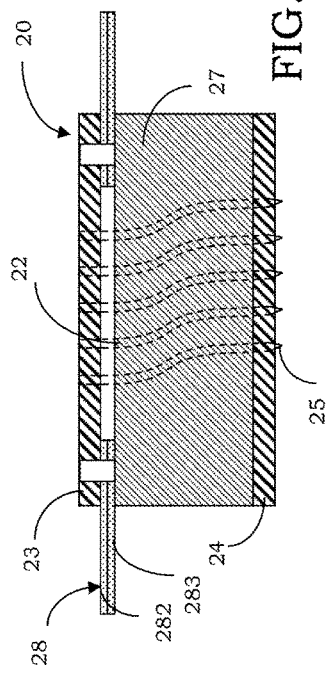

Finally the method comprises a restoring step of the retaining means 29 by a new tightening of the screws 31 into the respective threaded holes 32 in order to join again the upper guide 23, the spacer element 28 and the containment element 27, as shown in FIG. 8F.

It should be noted that in such case the regulation of the length of the terminal portions 25 of the contact probes 22 which project from the lower guide 24, has not caused a total removal of the spacer elements 28.

It is obviously possible to perform the further steps of removing one layer of the spacer elements 28 and approaching the upper guide 23 to the containment element 27, also at a later time of the life of the testing head 20, in particular when the terminal portions 25 of its contact probes 22 are further shortened for the use and have a length smaller than a length corresponding to a correct working of the testing head 20.

Furthermore, it is also possible, according to an embodiment of the invention, to remove one layer of the spacer elements 28 and approaching the upper guide 23 to the containment element 27 also in an asymmetrical manner with respect to central orthogonal axes of the upper guide 23 with a substantially rectangular shape, so as to regulate the length of the terminal portions 25 of the contact probes 22 in case of a misalignment of the respective contact tips due to the tolerances of the manufacturing process of the probes themselves.

In conclusion, the testing head with spacer elements according to the embodiments of the invention has a greater duration, since a great number of cleaning operations of the tips of the relative contact probes may be performed, and then it is possible to regulate the length of the terminal portions of the contact probes which project with respect to the lower guide, so being equal or greater than a length corresponding to a correct working of the testing head.

The method for adjusting the testing head with spacer elements according to the embodiments of the invention permits to recover in an easy and quick manner the correct working of the testing head itself after a working period which has caused a shortening of the terminal portions of its contact probes.

Furthermore, in case of use of multilayered or strippable spacer elements, it is possible to perform further adjustments of the length of the terminal portions of the contact probes in different moments of the working life of the testing head, in particular each time such terminal portions have been shortened for the use and have a length smaller than a length corresponding to a correct working of the testing head itself.

Finally, the testing head with spacer elements allows to adjust the length of the terminal portions of the contact probes in case of a misalignment of the respective contact tips due to the tolerances of the manufacturing process of the probes themselves.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A testing head for a testing equipment of an electronic device comprising:
   at least one upper guide and a lower guide provided with guide holes;
   a plurality of contact probes inserted into the guide holes of the upper and lower guides, each of the contact probes having at least one terminal portion which ends with a contact tip adapted to abut on a respective contact pad of the electronic device to be tested;
   at least one containment element of the probes disposed between the upper and lower guides; and
   at least one spacer element sandwiched between the containment element and at least one of the upper and lower guides, the spacer element being removable to adjust a length of the terminal portions of the contact probes projecting from the lower guide, wherein:
   the at least one spacer element includes a plurality of spacer elements positioned in correspondence with a contour of the upper or lower guide; and
   the plurality of spacer elements includes at least four corner spacer elements positioned at corners of the upper or lower guide with a substantially rectangular shape, and a at least four side spacer elements positioned at respective central portions of sides of the upper or lower guide, in different positions with respect of the four corner spacer elements.

2. The testing head of claim 1, wherein the spacer elements are interposed between the containment element and the upper guide.

3. The testing head of claim 1, further comprising retaining means joining the spacer elements, the containment element, and the upper or lower guide.

4. The testing head of claim 3, wherein each of the retaining means comprises at least one screw housed in a respective threaded hole, made in the upper or lower guide at a positioning point of a respective one of the spacer elements.

5. The testing head of claim 4, wherein each spacer element comprises at least one hole adapted to house the at least one screw.

6. The testing head of claim 1, wherein the plurality of spacer elements are positioned in an asymmetrical manner with respect to central orthogonal axes of the upper or lower guide, along the contour of the same.

7. The testing head of claim 1, wherein each spacer element is made of plastic.

8. The testing head of claim 1, wherein each spacer element is paddle-shaped and comprises an elongated body and a head having dimensions greater than those of the elongated body.

9. The testing head of claim 1, wherein each spacer element comprises a plurality of layers overlapping and individually removable.

10. The testing head of claim 9, wherein the layers are mutually joined by an adhesive material with a reduced sealing, so as to permit in an easy manner the separation of the layers one from another.

11. The testing head of claim 9, wherein the layers are superimposed one another along an axis which is orthogonal to a plane defined by the spacer element.

12. The testing head of claim 1, wherein each spacer element does not extend along a whole surface of the upper or lower guide.

13. The testing head of claim 1, wherein the spacer elements are positioned at a same level in correspondence with the contour of the upper or lower guide.

14. A testing head for a testing equipment of an electronic device comprising:
at least one upper guide and a lower guide provided with guide holes;
a plurality of contact probes inserted into the guide holes of the upper and lower guides, each of the contact probes having at least one terminal portion which ends with a contact tip adapted to abut on a respective contact pad of the electronic device to be tested;
at least one containment element of the probes disposed between the upper and lower guides; and
at least one spacer element sandwiched between the containment element and at least one of the upper and lower guides, wherein:
the spacer element does not extend along a whole surface of the upper or the lower guide and is removable to adjust a length of the terminal portions of the contact probes projecting from the lower guide;
the at least one spacer element includes a plurality of spacer elements positioned at a same level in correspondence with a contour of the upper or lower guide;
the plurality of spacer elements includes at least four corner spacer elements positioned at corners of the upper or lower guide with a substantially rectangular shape, and at least four side spacer elements positioned at respective central portions of sides of the upper or lower guide, in different positions with respect of the four corner spacer elements.

15. The testing head of claim 14, wherein the spacer elements are interposed between the containment element and the upper guide.

16. The testing head of claim 15, further comprising retaining means joining the spacer elements, the containment element, and the upper or lower guide.

17. The testing head of claim 16, wherein each of the retaining means comprises at least one screw housed in a respective threaded hole, made in the upper or lower guide at a positioning point of a respective one the spacer elements.

18. The testing head of claim 17, wherein each spacer element comprises at least one hole adapted to house the screw.

19. The testing head of claim 14, wherein the plurality of spacer elements are positioned in an asymmetrical manner with respect to central orthogonal axes of the upper or lower guide, along the contour of the same.

20. The testing head of claim 14, wherein each spacer element is made of plastic.

21. The testing head of claim 14, wherein each spacer element is paddle-shaped and comprises an elongated body and a head having dimensions greater than those of the elongated body.

22. The testing head of claim 14, wherein each spacer element comprises a plurality of layers overlapping and individually removable.

23. The testing head of claim 22, wherein the layers are mutually joined by an adhesive material with a reduced sealing, so as to permit in an easy manner the separation of the layers one from another.

24. The testing head of claim 22, wherein the layers are superimposed one another along an axis which is orthogonal to a plane defined by the spacer element.

* * * * *